United States Patent
Kajitani

(10) Patent No.: US 8,592,871 B2
(45) Date of Patent: Nov. 26, 2013

(54) NITRIDE SEMICONDUCTOR DEVICE AND METHOD OF MANUFACTURING NITRIDE SEMICONDUCTOR DEVICE

(75) Inventor: Ryo Kajitani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/494,321

(22) Filed: Jun. 12, 2012

(65) Prior Publication Data

US 2012/0248500 A1   Oct. 4, 2012

Related U.S. Application Data

(63) Continuation of application No. PCT/JP2010/006267, filed on Oct. 22, 2010.

(30) Foreign Application Priority Data

Dec. 18, 2009  (JP) .................................. 2009-287938

(51) Int. Cl.
*H01L 29/737*   (2006.01)

(52) U.S. Cl.
USPC ................... 257/198; 257/624; 257/E29.253; 257/E21.108; 257/76

(58) Field of Classification Search
USPC ............. 257/183, E29.005, E21.09, 76, 624, 257/615, E29.253, E21.08; 438/478
See application file for complete search history.

(56) References Cited

U.S. PATENT DOCUMENTS

| | | | |
|---|---|---|---|
| 7,030,421 B2 * | 4/2006 | Okuyama et al. | 257/89 |
| 7,601,993 B2 | 10/2009 | Hoshi et al. | |
| 7,777,305 B2 | 8/2010 | Kuroda et al. | |
| 7,923,753 B2 | 4/2011 | Mita et al. | |
| 7,936,049 B2 | 5/2011 | Kuroda et al. | |
| 8,013,320 B2 * | 9/2011 | Matsuo et al. | 257/13 |
| 8,390,010 B2 * | 3/2013 | Sills et al. | 257/98 |
| 2007/0051978 A1 | 3/2007 | Mita et al. | |
| 2007/0132037 A1 | 6/2007 | Hoshi et al. | |
| 2008/0217625 A1 | 9/2008 | Kuroda et al. | |
| 2009/0315122 A1 | 12/2009 | Hoshi et al. | |
| 2010/0264517 A1 | 10/2010 | Kuroda et al. | |
| 2011/0189826 A1 | 8/2011 | Mita et al. | |

FOREIGN PATENT DOCUMENTS

| | | |
|---|---|---|
| JP | 2007-053185 | 3/2007 |
| JP | 2007-158149 | 6/2007 |
| JP | 2007-165446 | 6/2007 |
| JP | 2008/227014 | 9/2008 |

OTHER PUBLICATIONS

International Search Report issued Jan. 11, 2011 in International (PCT) Application No. PCT/JP2010/006267.

* cited by examiner

*Primary Examiner* — Jarrett Stark
*Assistant Examiner* — Shahed Ahmed
(74) *Attorney, Agent, or Firm* — Wenderoth, Lind & Ponack, L.L.P.

(57) ABSTRACT

A nitride semiconductor device in which contact resistance between an ohmic electrode and an ohmic recess portion is reduced and a method of manufacturing the nitride semiconductor device are provided. The nitride semiconductor device includes: a first nitride semiconductor layer formed on a substrate; a second nitride semiconductor layer formed on the first nitride semiconductor layer and having a bandgap wider than a bandgap of the first nitride semiconductor layer; an ohmic recess portion formed in at least the second nitride semiconductor layer; and an ohmic electrode provided in contact with the ohmic recess portion. The ohmic recess portion includes a corrugated structure in at least a part of a plane in contact with the ohmic electrode.

10 Claims, 9 Drawing Sheets

NITRIDE SEMICONDUCTOR DEVICE AND METHOD OF MANUFACTURING NITRIDE SEMICONDUCTOR DEVICE

CROSS REFERENCE TO RELATED APPLICATION

This is a continuation application of PCT Patent Application No. PCT/JP2010/006267 filed on Oct. 22, 2010, designating the United States of America, which is based on and claims priority of Japanese Patent Application No. 2009-287938 filed on Dec. 18, 2009. The entire disclosures of the above-identified applications, including the specifications, drawings and claims are incorporated herein by reference in their entirety.

TECHNICAL FIELD

The present invention relates to a nitride semiconductor device and a method of manufacturing the nitride semiconductor device.

BACKGROUND ART

A group III nitride semiconductor typified by gallium nitride (GaN) has a wider bandgap, a faster saturation velocity, and a higher breakdown electric field than those of silicon (Si) and gallium arsenide (GaAs). Therefore, transistors which include the group III nitride semiconductor as material and are capable of providing high frequency and high power, such as a Field Effect Transistor (FET), have been actively developed.

A crystal having a wurtzite structure is used for the group III nitride semiconductor FET for its ease in crystal growth. For example, when a heterojunction interface is produced using AlGaN and GaN as the group III nitride semiconductor, a charge is generated on the interface by piezoelectric polarization and spontaneous polarization. Thus, two-dimensional electron gas is generated near the heterojunction interface, without doping an impurity. In the group III nitride semiconductor FET, the two-dimensional electron gas is used as a channel that is a path for electrons.

The following describes a structure of a general nitride semiconductor FET with reference to FIG. 10. First, a GaN channel layer 1102 and, an AlGaN barrier layer 1103 are sequentially grown on a substrate 1101, with the metalorganic chemical vapor deposition (MOCVD). At this time, as described above, in the GaN channel layer 1102, a channel 1104 formed by two-dimensional electron gas is generated near the heterojunction interface of the AlGaN barrier layer 1103 and the GaN channel layer 1102 as indicated by a dotted line in FIG. 10.

Next, a gate electrode 1108 and an ohmic electrode 1107 that is used as a source electrode and a drain electrode are formed on the AlGaN barrier layer 1103. At this time, the AlGaN barrier layer 1103 serves as a great potential barrier against the electrons, thereby preventing the electrons to flow from the ohmic electrode 1107 to the channel 1104. Accordingly, contact resistance in the ohmic electrode 1107 increases.

Therefore, as shown in FIG. 11, a channel 1204 is exposed by forming an ohmic recess portion 1205 by dry etching from a surface of the AlGaN barrier layer 1203, penetrating the AlGaN barrier layer 1203, to the GaN channel layer 1202, so that an ohmic electrode 1207 is in direct contact with the channel 1204. It is already disclosed that the ohmic electrode 1207 formed in such a manner is effective in reducing the contact resistance (see Patent Literature (PTL) 1, for example).

Furthermore, the ohmic recess portion 1205 is formed from the surface of the AlGaN barrier layer 1203, penetrating the AlGaN barrier layer 1203, to a position deeper than the channel 1204 in the GaN channel layer 1202, by dry etching. It is already disclosed that increasing the area of the lateral side of the ohmic recess portion 1205 is effective in reducing the contact resistance (see PTL 2, for example).

CITATION LIST

Patent Literature

[PTL1] Japanese Unexamined Patent Application Publication No. 2007-053185
[PTL2] Japanese Unexamined Patent Application Publication No. 2007-165446

SUMMARY OF INVENTION

Technical Problem

Although forming the ohmic recess portion by dry etching increases the area of the lateral side of the ohmic recess portion, there are cases where crystal defects are caused by dry etching in the lateral side of the ohmic recess portion, which causes a high-resistance layer. This high-resistance layer increases the contact resistance.

The present invention has an object to solve the above problems and provide a nitride semiconductor device in which the contact resistance between the ohmic electrode and the ohmic recess portion is reduced, and a method of manufacturing the nitride semiconductor device.

Solution to Problem

In order to achieve the above objective, a nitride semiconductor device according to an aspect of the present invention includes: a first nitride semiconductor layer formed on a substrate; a second nitride semiconductor layer formed on the first nitride semiconductor layer and having a bandgap wider than a bandgap of the first nitride semiconductor layer; an ohmic recess portion formed in at least the second nitride semiconductor layer; and an ohmic electrode provided in contact with the ohmic recess portion. The ohmic recess portion includes a corrugated structure in at least a part of a plane in contact with the ohmic electrode.

With this structure, the corrugated structure is included in at least a part of an end surface (wall surface and bottom surface) of the ohmic recess portion, whereby surface area of the ohmic recess portion is increased. Accordingly, it is possible to increase contact area of the ohmic electrode and the ohmic recess portion, and reduce contact resistance between the ohmic electrode and the ohmic recess portion.

Here, the corrugated structure may be formed by wet etching.

With this structure, it is possible to remove the high-resistance layer caused by the crystal defects by wet etching, and form the corrugated structure in at least a part of the end surface (wall surface and bottom surface) of the ohmic recess portion. Accordingly, it is possible to increase the contact area of the ohmic electrode and the ohmic recess portion, and reduce the contact resistance.

Here, the corrugated structure may be configured in the form of triangles each of which mainly has a (−1100) plane and a (01-10) plane.

Furthermore, the first nitride semiconductor layer and the second nitride semiconductor layer may be stacked in a <0001> direction, and the corrugated structure may be formed in a plane that is of the ohmic recess portion and perpendicular to a <11-20> direction.

Furthermore, the first nitride semiconductor layer and the second nitride semiconductor layer may be stacked in a <1-100> direction, and the corrugated structure may be formed in a plane that is of the ohmic recess portion and perpendicular to the <11-20> direction.

Furthermore, the first nitride semiconductor layer and the second nitride semiconductor layer may be stacked in the <11-20> direction, and the corrugated structure may be formed in a plane that is of the ohmic recess portion and perpendicular to the <11-20> direction.

With this structure, it is possible to form a minute corrugated structure configured in the form of triangles each of which mainly has the (−1100) plane and the (01-10) plane, using the (−1100) plane and the (01-10) plane of the crystal lattice.

Furthermore, the corrugated structure may be formed in a plane that is of the ohmic recess portion and perpendicular to the <1-100> direction, and may be configured in the form of grooves each of which has a (10-10) plane that is formed in parallel to the <11-20> direction.

With this structure, it is possible to form a minute corrugated structure in the form of grooves, in parallel to the <11-20> direction, using the (10-10) plane of the crystal lattice.

In order to solve the above problem, a method of manufacturing a nitride semiconductor device including an ohmic electrode according to an aspect of the present invention includes: forming a first nitride semiconductor layer on a substrate; forming, on the first nitride semiconductor layer, a second nitride semiconductor layer which has a bandgap wider than a bandgap of the first nitride semiconductor layer; forming an ohmic recess portion in at least the second nitride semiconductor layer; and forming a corrugated structure in at least a part of a plane in contact with the ohmic electrode in the ohmic recess portion.

With this structure, the corrugated structure is included in at least a part of an end surface (wall surface and bottom surface) of the ohmic recess portion, whereby the surface area of the ohmic recess portion is increased. Accordingly, it is possible to increase the contact area of the ohmic electrode and the ohmic recess portion, and reduce the contact resistance between the ohmic electrode and the ohmic recess portion.

Here, in the forming of a corrugated structure, the corrugated structure may be formed by wet etching.

With this structure, it is possible to remove the high-resistance layer caused by the crystal defects by wet etching, and form the corrugated structure on at least a part of the end surface (wall surface and bottom surface) of the ohmic recess portion. Accordingly, it is possible to increase the contact area of the ohmic electrode and the ohmic recess portion, and reduce the contact resistance.

Here, the method of manufacturing a nitride semiconductor device may further include forming the ohmic electrode in contact with the ohmic recess portion.

With this structure, it is possible to increase the contact area of the ohmic electrode and the ohmic recess portion, and reduce the contact resistance, because the ohmic electrode is formed in contact with the end surface (wall surface and bottom surface) of the ohmic recess portion having the minute corrugated structure.

Advantageous Effects of Invention

With the nitride semiconductor device according to the present invention, the contact resistance between the ohmic electrode and the ohmic recess portion can be reduced.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings:

FIG. 3 illustrates the upper surface view of the nitride semiconductor device shown in FIG. 2B in detail.

DESCRIPTION OF EMBODIMENTS

The following describes embodiments of a nitride semiconductor device according to the present invention with reference to the drawings. Although the following description is based on the embodiments below and the drawings attached, the embodiments and the drawings are given for illustrative purpose only and are not intended to limit the scope of the present inventive concept.

Embodiment 1

The following describes a structure of a nitride semiconductor device according to Embodiment 1 of the present invention. The present embodiment describes the nitride semiconductor device including: a first nitride semiconductor layer formed on a substrate; a second nitride semiconductor layer formed on the first nitride semiconductor layer and having a bandgap wider than a bandgap of the first nitride semiconductor layer; an ohmic recess portion formed in at least the second nitride semiconductor layer; and an ohmic electrode provided in contact with the ohmic recess portion. The ohmic recess portion includes a corrugated structure in at least a part of a plane in contact with the ohmic electrode. With the above nitride semiconductor device, it is possible to reduce the contact resistance between the ohmic electrode and the ohmic recess portion.

First, the following describes a method of further reducing the contact resistance between the ohmic electrode and the ohmic recess portion than that of the conventional technique, found by the inventor of the present application.

Figure 1A:
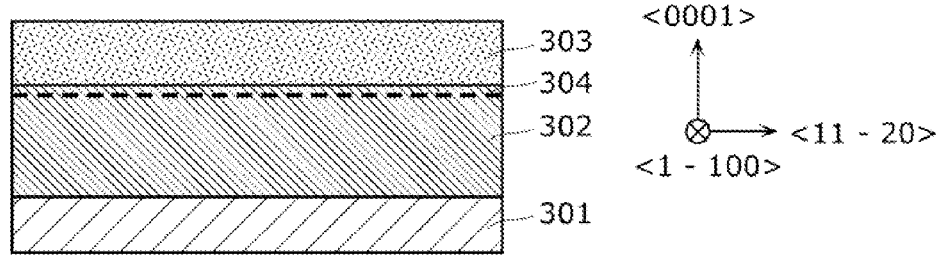
FIG. 1A is a cross-sectional view for illustrating a structure of a nitride semiconductor device according to Embodiment 1 of the present invention.

As shown in FIG. 1A, a GaN channel layer 302 and an AlGaN barrier layer 303 are sequentially grown on a main surface of a substrate 301, with the metalorganic chemical vapor deposition (MOCVD). The substrate 301 includes silicon (Si), gallium nitride (GaN), sapphire, or silicon carbide (SiC). The GaN channel layer 302 has the thickness of 2 μm. The AlGaN barrier layer 303 has the thickness of 25 nm (10 nm to 500 nm) and includes $Al_{0.30}Ga_{0.70}N$, for example. The bandgap of the AlGaN barrier layer 303 is wider than the bandgap of the GaN channel layer 302. Thus, a channel 304 formed by two-dimensional electron gas is generated in the heterojunction interface of the GaN channel layer 302 and the AlGaN barrier layer 303. In $Al_xIn_yGa_{1-x-y}N$ (0≤x≤1, 0≤y≤1, 0≤x+y≤1), the GaN channel layer 302 includes a nitride semiconductor which has x=0 and y=0, and the AlGaN barrier layer 303 includes a nitride semiconductor which has x=0.30 and y=0.

Figure 1B:
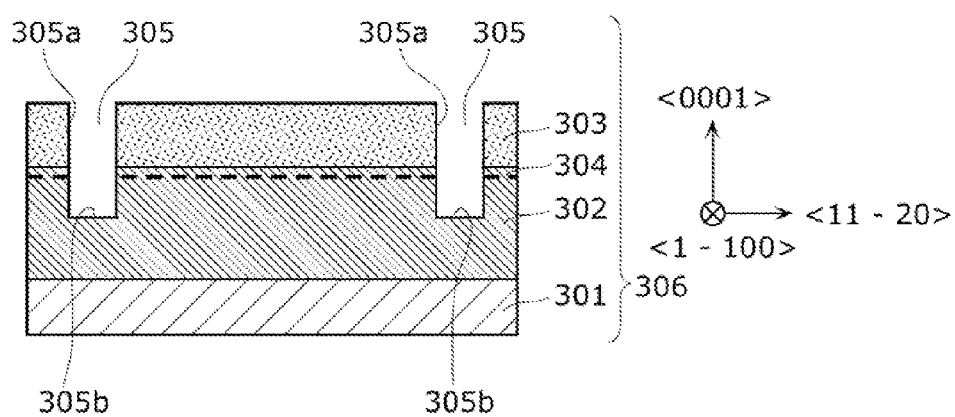
FIG. 1B is a cross-sectional view for illustrating the structure of the nitride semiconductor device according to Embodiment 1 of the present invention.
Figure 1C:
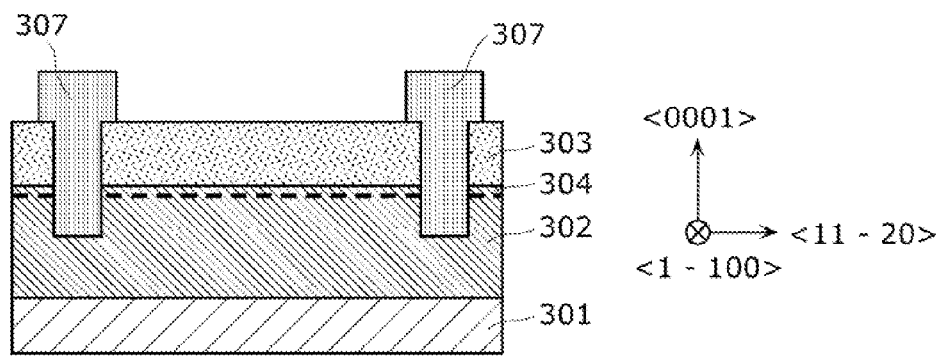
FIG. 1C is a cross-sectional view for illustrating the structure of the nitride semiconductor device according to Embodiment 1 of the present invention.

Next, a mask having a given pattern is placed on an upper surface of the AlGaN barrier layer 303, and the AlGaN barrier layer 303 is dry etched so that an ohmic recess portion 305 in the form of a concave is formed, as shown in FIG. 1B. As shown in FIG. 1C, the ohmic recess portion 305 is a contact portion for providing an ohmic electrode 307, which is a source electrode and a drain electrode of the FET, in contact with the GaN channel layer 302 and the AlGaN barrier layer 303. The ohmic recess portion 305 is formed in the form of a concave from the upper surface of the AlGaN barrier layer 303, penetrating the AlGaN barrier layer 303, to the GaN channel layer 302, and has a wall surface 305a and a bottom surface 305b as shown in FIG. 1B. This is how a stacked structure 306 included in the nitride semiconductor device is formed.

At this time, a high-resistance layer is formed in the wall surface 305a of the ohmic recess portion 305 by dry etching. That is, the ohmic recess portion 305 is formed by dry etching, which may cause crystal defects by etching on the wall surface 305a of the ohmic recess portion 305. The crystal defects cause the wall surface 305a of the ohmic recess portion 305 to have a higher resistance, and the high-resistance layer having the higher resistance increases the contact resistance. In order to reduce the contact resistance, it is required to remove the high-resistance layer by wet etching or the like.

The high-resistance layer is removed by immersing the stacked structure 306 in a potassium hydroxide (KOH) solution in 25 degrees Celsius and having a concentration of 0.1 mol/l for 40 minutes, and performing wet etching. Thus, the ohmic recess portion 305 is etched in a lateral direction, namely, in a direction perpendicular to the wall surface 305a, whereby the high-resistance layer is removed.

Figure 2A:
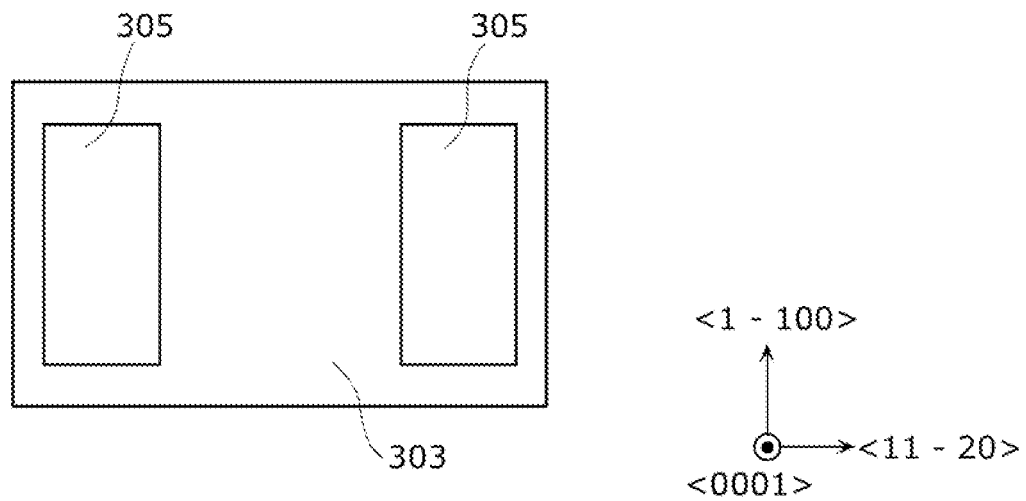
FIG. 2A is an upper surface view of the nitride semiconductor device, before wet etching is performed, according to Embodiment 1 of the present invention.
Figure 2B:
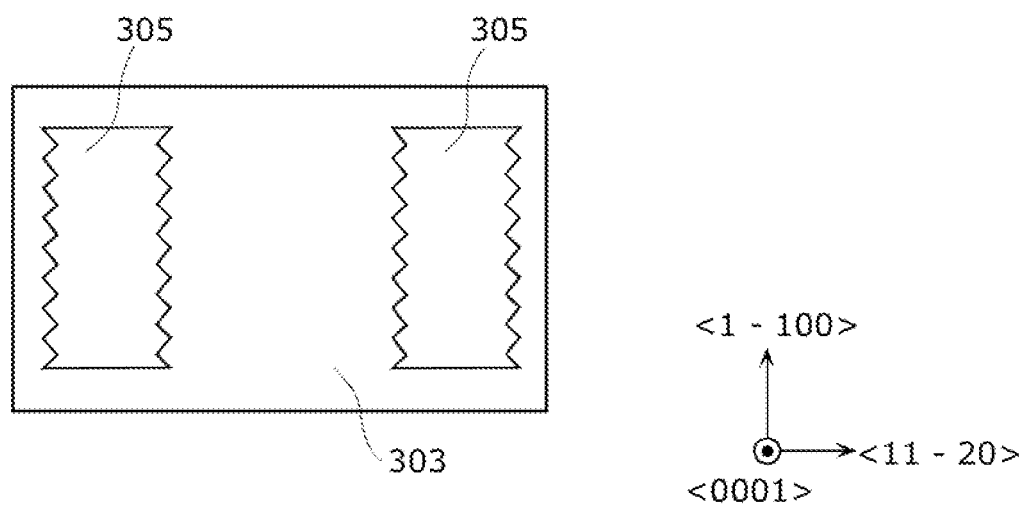
FIG. 2B is an upper surface view of the nitride semiconductor device, after wet etching is performed, according to Embodiment 1 of the present invention.

FIG. 2A is the upper surface view of the stacked structure 306 before the wet etching is performed and FIG. 2B is the upper surface view of the stacked structure 306 after the wet etching is performed.

As in the upper surface view of the nitride semiconductor device shown in FIG. 2A, when an end surface in a longitudinal direction of the ohmic recess portion 305 is formed substantially in parallel to the <1-100> direction, the corrugated structure as shown in FIG. 2B is formed as a result of performing wet etching with KOH solution. Specifically, the corrugated structure formed in the plane perpendicular to the <11-20> direction and the corrugated structure in the plane perpendicular to the <1-100> direction, by etching, are different because the plane directions are different.

FIG. 3 illustrates the upper surface view of the nitride semiconductor device shown in FIG. 2B in detail.

Figure 3A:
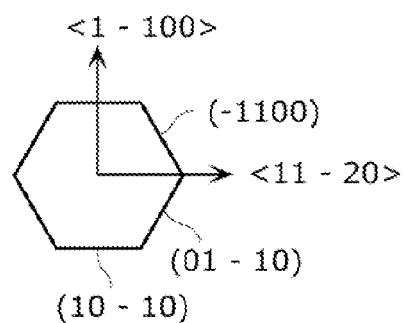
FIG. 3A is a schematic view showing a plane direction of a nitride semiconductor and FIG. 3B is a partially enlarged view of the nitride semiconductor device shown in FIG. 2B.
Figure 3B:
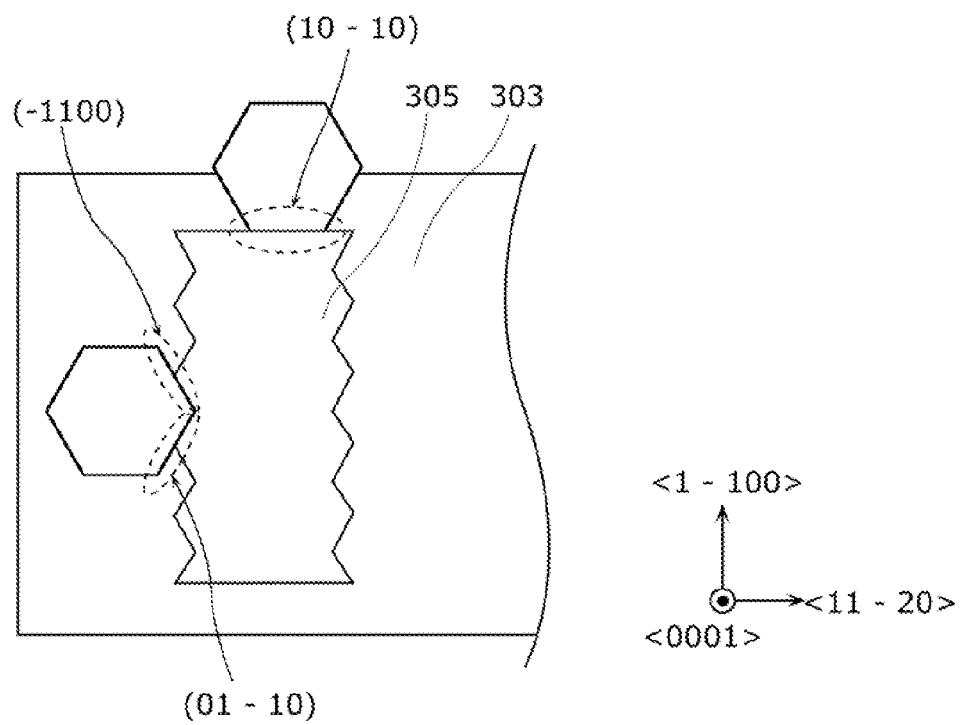

Here, FIG. 3A shows the plane direction of the nitride semiconductor $Al_xIn_yGa_{1-x-y}N$ (0≤x≤1, 0≤y≤1, 0≤x+y≤1). $Al_xIn_yGa_{1-x-y}N$ is a crystal having a wurtzite structure, and the plane direction is defined by notation of a crystal surface having a hexagonal crystal structure that is the same as that of sapphire, SIC, and the like, as shown FIG. 3A. As shown in FIG. 3B, the ohmic recess portion 305 is formed in the form of a rectangle which has a longitudinal direction in the <1-100> direction, when it is observed from the upper surface of the AlGaN barrier layer 303. Furthermore, as shown in FIG. 2B, the ohmic recess portion 305 is formed in two parts when it is observed from the upper surface of the AlGaN barrier layer 303.

As described above, when the wall surface 305a of the ohmic recess portion 305 is wet etched with KOH solution, a minute corrugated structure is formed in the wall surface 305a of the ohmic recess portion 305. This is because $Al_xIn_yGa_{1-x-y}N$ is etched in a crystal lattice unit in the wall surface 305a of the ohmic recess portion 305 so that a facet which has a (−1100) plane and a (01-10) plane is exposed in the wall surface 305a that is of the ohmic recess portion 305 and perpendicular to the <11-20> direction while a facet which has a (10-10) plane is exposed in the wall surface 305a that is of the ohmic recess portion 305 and perpendicular to the <1-100> direction, as shown in FIG. 3B.

Thus, in the wall surface 305a that is of the ohmic recess portion. 305 and perpendicular to the <11-20> direction of the ohmic recess portion 305, as shown in FIG. 3B, a minute corrugated structure in the form of triangles is formed. The corrugated structure is in the form of triangles each of which mainly has the (−1100) plane and the (01-10) plane when it is observed from the upper surface and a side of 30 nm or approximately 10 nm to 500 nm. At this time, $Al_xIn_yGa_{1-x-y}N$ is etched in a crystal lattice unit even when the longitudinal direction of the ohmic recess portion 305 is not completely parallel to the <1-100> direction, whereby the corrugated structure in the form of triangles each of which has the (−1100) plane and the (01-10) plane is formed by wet etching processing with KOH solution. A side of the corrugated structure in the form of triangles each of which has the (−1100) plane and the (01-10) plane becomes longer as the molar concentration of the KOH solution increases. For example, the side of the triangle is (i) approximately 100 nm when the molar concentration of the KOH solution is 3 mol/l and (ii) approximately 30 nm when the molar concentration of the KOH solution is 0.1 mol/l.

Furthermore, in the wall surface 305a that is of the ohmic recess portion 305 and perpendicular to the <1-100> direction of the ohmic recess portion 305, a large number of grooves each of which has a (10-10) plane are formed in parallel to the <11-20> direction. Therefore, the wall surface 305a that is of the ohmic recess portion 305 and perpendicular to the <1-100> direction is almost linear (substantially parallel to the (10-10) plane) when it is observed from the upper surface, as shown in FIG. 3B. It is to be noted that the solution used for wet etching is not limited to KOH and other alkali solution such as NaOH may be used.

In order to reduce the contact resistance between the ohmic electrode 307 and the ohmic recess portion 305, it is appropriate to have a large contact area of the ohmic electrode 307 and the ohmic recess portion 305, and providing a corrugated structure in the wall surface 305a of the ohmic recess portion 305 is effective in increasing the contact area. In contrast, when the corrugated structure is too large, the electric field may concentrate at the corrugated structure which may break the device. Accordingly, in order to prevent the electric field from concentrating, it is appropriate to make the corrugated structure minute and a side of the triangle as short as possible. An example of a method of achieving the minute corrugated structure includes a method including forming a resist, patterning a corrugated structure in minute form which is as fine as a few nm order in the resist by exposing to Electron Beam (EB), and then performing dry etching with a resist mask. However, in this case, a large quantity of crystal defects is formed in a wall surface of the formed pattern because of dry etching, abrasion of the resist, and the like. These defects increase the contact resistance. Furthermore, when wet etching by a method other than the above method is performed to remove the crystal defects in the wall surface of the pattern, the formed fine pattern is lost by etching. However, the inventor has found that, in this method, the corrugated structure in the fine form which has a triangle whose a side is several tens nm to several hundreds nm can be self-formed.

It is to be noted that the wall surface 305a in the longitudinal direction of the ohmic recess portion 305 formed by dry etching is not necessarily parallel to the <1-100> direction as shown in the above embodiment. Because the wall surface 305a and the bottom surface 305b of the ohmic recess portion 305 are etched in a crystal lattice unit by wet etching even when the wall surface 305a and the bottom surface 305b are angled from approximately negative 45 degrees to positive 45 degrees with respect to the <1-100> direction, the minute corrugated structure can be formed in the wall surface 305a and the bottom surface 305b of the ohmic recess portion 305, and the advantageous effects of the present invention are provided.

In order to investigate the effect of reduction in the contact resistance brought by etching with KOH solution, an assessment of the contact resistance was performed by Transfer Lign Method (TLM), in a case where the ohmic recess portion 305 is formed in the form of a rectangle in the <11-20> direction and the <1-100> direction, processed with KOH solution for 40 minutes, and applied with a current in the <1-100> direction and the <11-20> direction.

Figure 4:
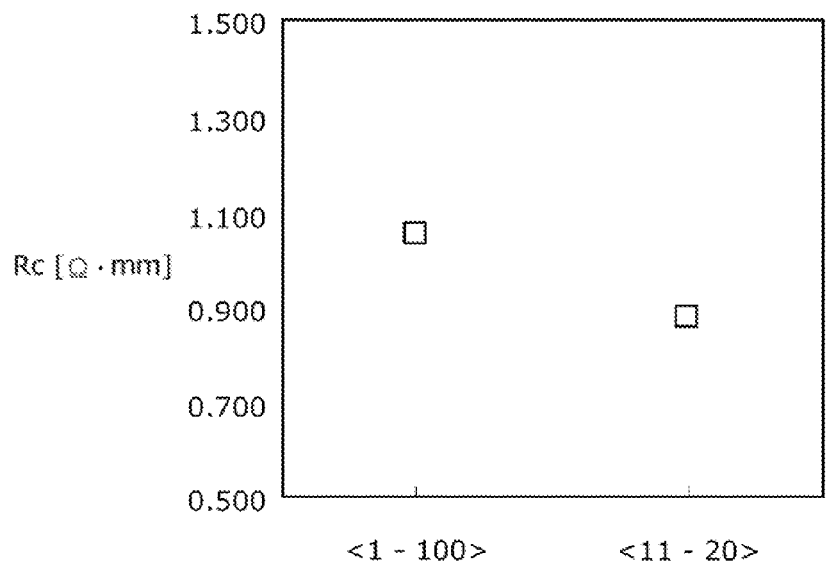
FIG. 4 shows a contact resistance value between an ohmic recess portion in a <1-100> direction and a <11-20> direction.

FIG. 4 shows a contact resistance value in the <1-100> direction and the <11-20> direction of an ohmic recess portion. What is shown is the contact resistance value in a case where the ohmic recess portion 305 formed in the form of a rectangle was wet etched with KOH solution in 25 degrees Celsius and having the concentration of 0.1 mol/l for 40 minutes, the ohmic recess portion 305 was formed with, for example, the ohmic electrode 307 including Ti/Al as shown in FIG. 1C, and current was applied to the ohmic electrode 307 with setting conductive surfaces of the ohmic electrode 307 to the <11-20> direction and the <1-100> direction.

FIG. 4 shows that, when the wet etching with KOH solution was performed, the contact resistance value when the current was applied in the <11-20> direction (approximately 0.9Ω·mm) was distinctly lower than the contact resistance value when the current was applied in the <1-100> direction (approximately 1.1Ω·mm). This is because, in the <11-20> direction, the corrugated structure in the form of triangles each of which has the (−1100) plane and the (01-10) plane was formed as described above and the surface area was increased than that of in the <1-100> direction, whereby the contact resistance was reduced. Furthermore, an electrical contact was not achieved when processing with KOH solution was not performed, because crystal defects due to dry etching were caused in the wall surface 305a of the ohmic recess portion 305 and the resistance of the wall surface 305a increased.

The following describes the nitride semiconductor device to which a condition for reducing the contact resistance found by the inventor of the present application is applied.

Figure 5:
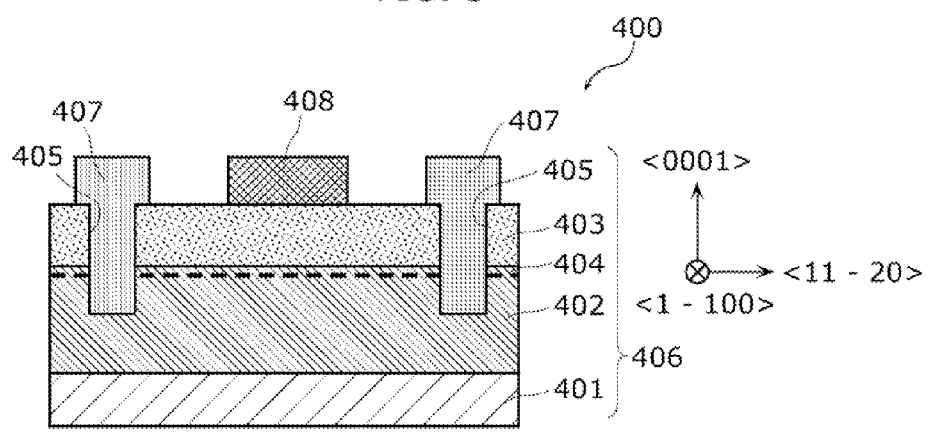
FIG. 5 is a cross-sectional view showing the structure of the nitride semiconductor device according to Embodiment 1 of the present invention.

FIG. 5 is a cross-sectional view showing a structure of a nitride semiconductor device 400 according to the present embodiment.

As shown in FIG. 5, the nitride semiconductor device 400 according to the present embodiment includes (i) a stacked structure 406 which includes a substrate 401, a GaN channel layer 402 which is a first nitride semiconductor layer, an AlGaN barrier layer 403 which is a second nitride semiconductor layer, and an ohmic recess portion 405, (ii) an ohmic electrode 407, and (iii) a gate electrode 408. The bandgap of the AlGaN barrier layer 403 is wider than the bandgap of the GaN channel layer 402. Furthermore, a channel 404 formed by two-dimensional electron gas is generated near the heterojunction interface of the GaN channel layer 402 and the AlGaN barrier layer 403.

Each of FIG. 6A to FIG. 6D is a cross-sectional view showing a manufacturing process of the nitride semiconductor device 400 according to the present embodiment.

Figure 6A:
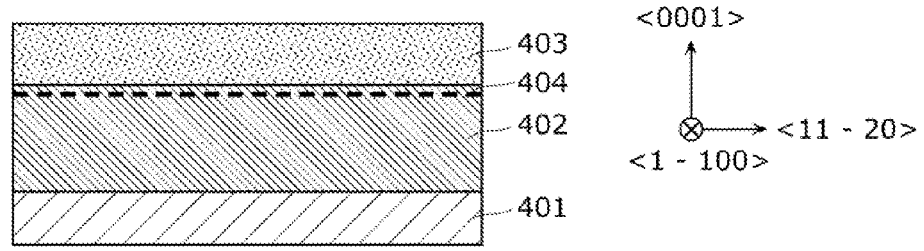
FIG. 6A is a cross-sectional view showing a manufacturing process of the nitride semiconductor device according to Embodiment 1 of the present invention.

As shown in FIG. 6A, with MOCVD, a GaN channel layer 402 and an AlGaN barrier layer 403 are sequentially grown on a main surface of a substrate 401, in a +c plane direction (<0001> direction). The substrate 401 includes Si, GaN, sapphire, or SiC. The GaN channel layer 402 has the thickness of 2 μm. The AlGaN barrier layer 403 has the thickness of 25 nm (10 nm to 500 nm) and includes $Al_{0.30}Ga_{0.70}N$. At this time, the channel 404 formed by two-dimensional electron gas is generated in a part of the GaN channel layer 402.

It is to be noted that the main surface of the substrate 401 is a surface on which the GaN channel layer 402 and the AlGaN barrier layer 403 are grown in the +c plane direction. Furthermore, when the substrate 401 includes GaN, a buffer layer is required between the substrate 401 and the GaN channel layer 402. The buffer layer preferably includes AlN which has a high resistance, however, AlGaN or GaN may be included instead. In the same manner, when the substrate 401 includes Si, sapphire, or SiC, a buffer layer including GaN, AlGaN, AlN, or the like may be formed between the substrate 401 and the GaN channel layer 402.

Figure 6B:
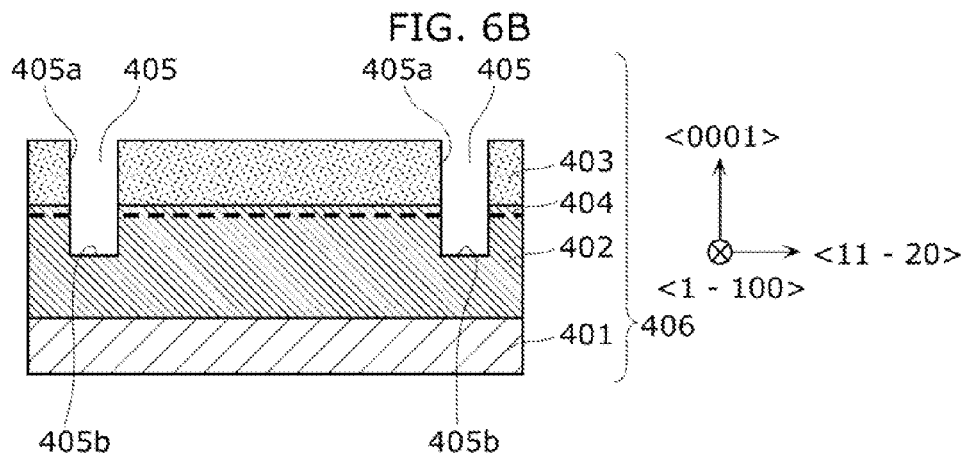
FIG. 6B is a cross-sectional view showing a manufacturing process of the nitride semiconductor device according to Embodiment 1 of the present invention.

Next, as shown in FIG. 6B, a mask having a given pattern is placed and the AlGaN barrier layer 403 is dry etched so that the ohmic recess portion 405 is formed. At this time, the ohmic recess portion 405 is formed so that the longitudinal direction is substantially parallel to the <1-100> direction. Furthermore, the ohmic recess portion 405 is formed to penetrate the AlGaN barrier layer 403, not to penetrate the GaN channel layer 402, and reach lower than the channel 404 formed by two-dimensional electron gas.

The stacked structure 406 formed in the above manner is immersed in KOH solution in 25 degrees Celsius and having a concentration of 0.1 mol/l for 40 minutes, and wet etched. Thus, the high-resistance layer caused by the crystal defects due to dry etching is removed. Concurrently, a corrugated structure formed by facets each of which has the (−1100) plane and the (01-10) plane is formed in the wall surface 405a that is of the ohmic recess portion 405 and perpendicular to the <11-20> direction.

Figure 6C:
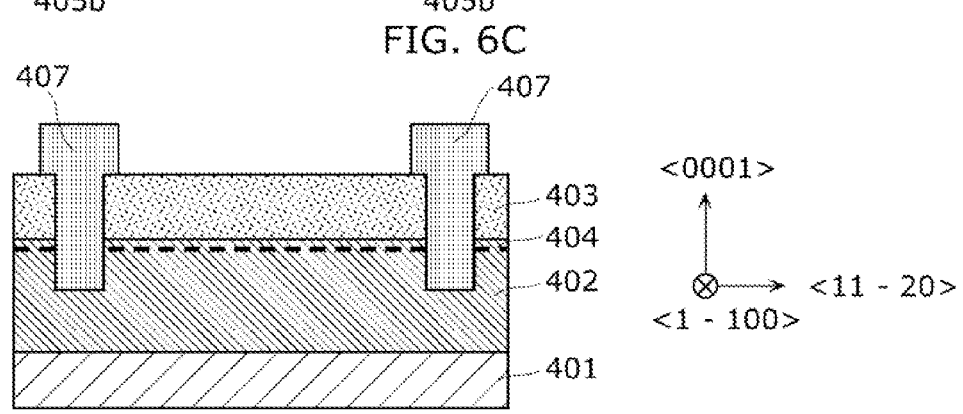
FIG. 6C is a cross-sectional view showing a manufacturing process of the nitride semiconductor device according to Embodiment 1 of the present invention.

Next, as shown in FIG. 6C, the ohmic electrode 407 including, for example, Ti/Al is formed so as to cover the ohmic recess portion 405. The ohmic electrode 407 is in contact with (i) the AlGaN barrier layer 403 and the GaN channel layer 402 at the wall surface 405a of the ohmic recess portion 405 and (ii) the GaN channel layer 402 at the bottom surface 405b of the ohmic recess portion 405.

Figure 6D:
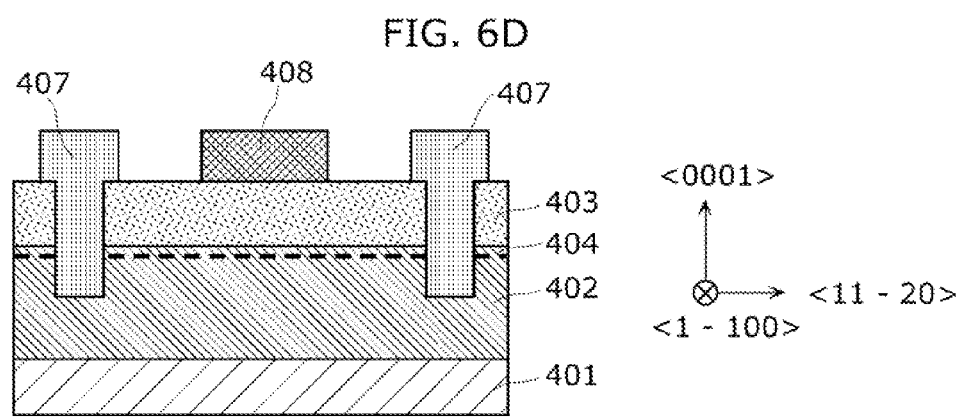
FIG. 6D is a cross-sectional view showing a manufacturing process of the nitride semiconductor device according to Embodiment 1 of the present invention.

Next, as shown in FIG. 6D, the gate electrode 408 including, for example, Ni/Au is formed. At this time, the gate electrode 408 is formed in the form of a rectangular parallelepiped which has a longitudinal direction in the <1-100> direction, that is, in a direction parallel to the longitudinal direction of the ohmic electrode 407 formed in the ohmic recess portion 405. The ohmic electrode 407 and the gate electrode 408 are formed by sputtering, for example.

This is how the ohmic recess portion 405 is wet etched with KOH solution so that the high-resistance layer formed in the wall surface 405a of the ohmic recess portion 405 is removed. Concurrently, the contact resistance can be reduced than in the conventional technique by suppressing the concentration of the electric field to, for example, a part having crystal defects because of the minute corrugated structure formed in the wall surface 405a of the ohmic recess portion 405 while increasing the contact area of the ohmic electrode 407 and the wall surface 405a of the ohmic recess portion 405.

It is to be noted that the ohmic recess portion 405 does not necessarily penetrate the AlGaN barrier layer 403 and may be formed, in the form of a concave, in the AlGaN barrier layer 403 only. Even in the above case, the minute corrugated structure is formed in the AlGaN barrier layer 403 of the wall surface 405a of the ohmic recess portion 405, and the advantageous effects of the present invention are provided.

Furthermore, the corrugated structure is not limited to be formed in the wall surface 405a, but also may be formed in the bottom surface 405b that are of the ohmic recess portion 405. In this case, the contact area of the ohmic recess portion 405 and the ohmic electrode 407 increases in the bottom surface 405b as well, whereby the contact resistance is further reduced.

Embodiment 2

The following describes Embodiment 2 according to the present invention. Embodiment 2 is different from Embodiment 1 in the point that the crystal growth of the GaN channel layer and the AlGaN barrier layer is performed in a +m plane direction (<1-100> direction) in Embodiment 2, although the crystal growth of the GaN channel layer and the AlGaN barrier layer has been performed in the +c plane direction (<0001> direction) in Embodiment 1. In Embodiment 2, in the same manner as in Embodiment 1, it is possible to reduce the contact resistance by increasing the surface area of the wall surface of the ohmic recess portion.

Each of FIG. 7A to FIG. 7D is a cross-sectional view showing a manufacturing process of the nitride semiconductor device according to the present embodiment.

Figure 7A:
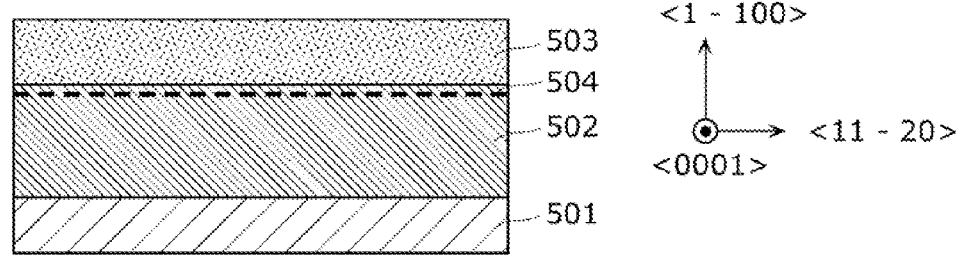
FIG. 7A is a cross-sectional view showing a manufacturing process of a nitride semiconductor device according to Embodiment 2 of the present invention.

As shown in FIG. 7A, with MOCVD, a GaN channel layer 502 and an AlGaN barrier layer 503 are sequentially grown on a main surface of a substrate 501, in the +m plane direction (<1-100> direction). The substrate 501 includes Si, GaN, sapphire, or SiC. The GaN channel layer 502 has the thickness of 2 μm. The AlGaN barrier layer 503 has the thickness of 25 nm (10 nm to 500 nm) and includes n-type $Al_{0.30}Ga_{0.70}N$ doped with Si. At this time, by the doping of Si, an electric field is generated at the heterojunction interface of the AlGaN barrier layer 503 and the GaN channel layer 502, whereby the charges are attracted to the heterojunction interface. Thus, the channel 504 formed by two-dimensional electron gas is generated in a part of the GaN channel layer 502.

It is to be noted that the main surface of the substrate 501 is a surface on which the GaN channel layer 502 and the AlGaN barrier layer 503 are grown in the +m plane direction. When the substrate 501 includes GaN, a buffer layer is required between the substrate 501 and the GaN channel layer 502. The buffer layer preferably includes AlN which has a high resistance, however, AlGaN or GaN may be included instead. In the same manner, when the substrate 501 includes Si, sapphire, or SiC, a buffer layer including GaN, AlGaN, AlN, or the like may be formed between the substrate 501 and the GaN channel layer 502.

Figure 7B:
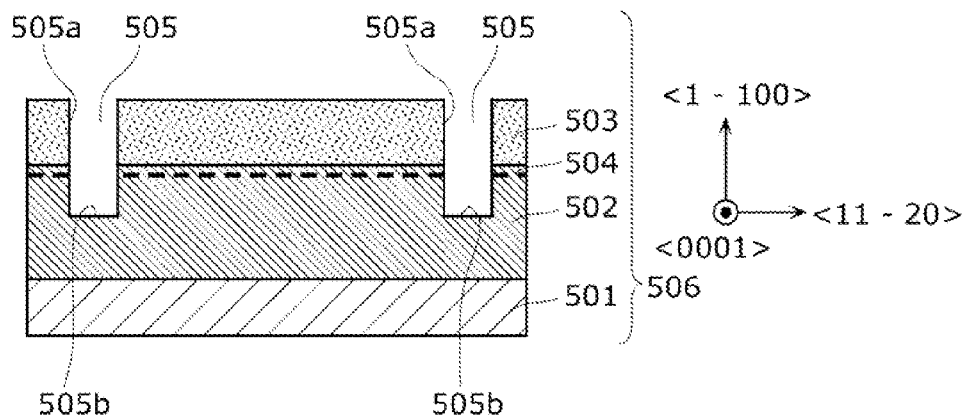
FIG. 7B is a cross-sectional view showing a manufacturing process of the nitride semiconductor device according to Embodiment 2 of the present invention.

Next, as shown in FIG. 7B, a mask having a given pattern is placed and the AlGaN barrier layer 503 is dry etched so that the ohmic recess portion 505 is formed. At this time, the ohmic recess portion 505 is formed so that the longitudinal direction is substantially parallel to the <0001> direction. Furthermore, the ohmic recess portion 505 is formed to penetrate the AlGaN barrier layer 503, not to penetrate the GaN channel layer 502, and reach lower than the channel 504 formed by two-dimensional electron gas.

The stacked structure 506 formed in the above manner is immersed in KOH solution in 25 degrees Celsius and having a concentration of 0.1 mol/l for 40 minutes, and wet etched. Thus, the high-resistance layer caused by the crystal defects due to dry etching is removed. Concurrently, a corrugated structure formed by facets each of which has the (−1100) plane and the (01-10) plane is formed in the wall surface 505a that is of the ohmic recess portion 505 and perpendicular to the <11-20> direction of the ohmic recess portion 505.

Figure 7C:
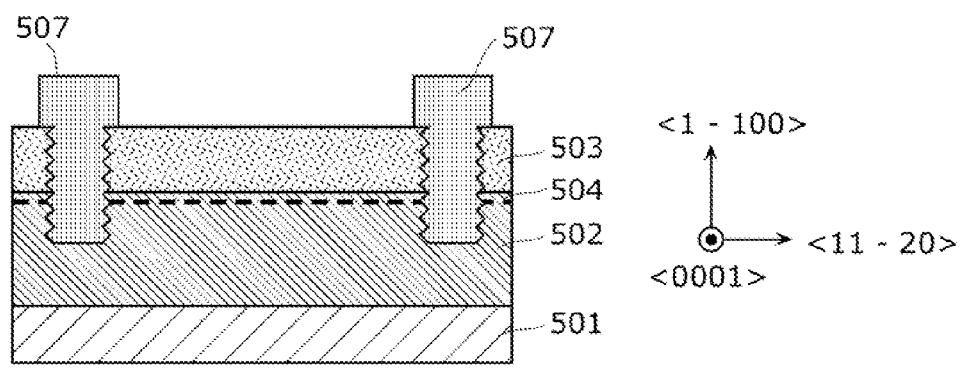
FIG. 7C is a cross-sectional view showing a manufacturing process of the nitride semiconductor device according to Embodiment 2 of the present invention.

Next, as shown in FIG. 7C, the ohmic electrode 507 including, for example, Ti/Al is formed so as to cover the ohmic recess portion 505. The ohmic electrode 507 is in contact with (i) the AlGaN barrier layer 503 and the GaN channel layer 502 at the wall surface 505a of the ohmic recess portion 505 and (ii) the GaN channel layer 502 at the bottom surface 505b of the ohmic recess portion 505.

Figure 7D:
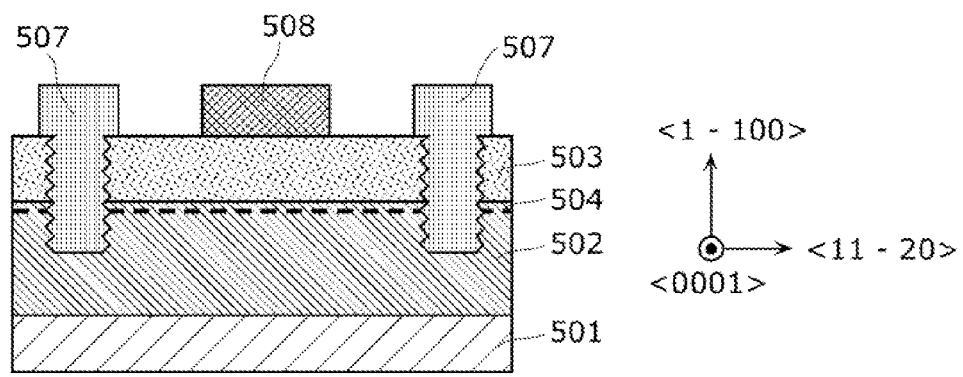
FIG. 7D is a cross-sectional view showing a manufacturing process of the nitride semiconductor device according to Embodiment 2 of the present invention.

Next, as shown in FIG. 7D, the gate electrode 508 including, for example, Ni/Au is formed. At this time, the gate electrode 508 is formed in the form of a rectangular parallelepiped which has a longitudinal direction in the <0001> direction, that is, in a direction parallel to the longitudinal direction of the ohmic electrode 507 formed in the ohmic recess portion 505. The ohmic electrode 507 and the gate electrode 508 are formed by sputtering, for example.

This is how the ohmic recess portion 505 is wet etched with KOH solution so that the high-resistance layer formed in the wall surface 505a of the ohmic recess portion 505 is removed. Concurrently, the contact resistance can be reduced than in the conventional technique by suppressing the concentration of the electric field to, for example, a part having crystal defects because of the minute corrugated structure formed in the wall surface 505a of the ohmic recess portion 505 while increasing the contact area of the ohmic electrode 507 and the wall surface 505a of the ohmic recess portion 505.

Embodiment 3

The following describes Embodiment 3 according to the present invention. Embodiment 3 is different from Embodiment 1 in the point that the ohmic recess portion is formed only in the AlGaN barrier layer which is the second nitride semiconductor layer in the nitride semiconductor device according to the present embodiment. In Embodiment 1, it is intended to increase the surface area of the wall surface of the ohmic recess portion. However, when the bottom surface of the ohmic recess portion is closer to the upper surface than the AlGaN/GaN interface, current flows from the bottom surface of the ohmic recess portion. Therefore, the contact resistance can be reduced by increasing the surface area of the bottom surface of the ohmic recess portion and therefore making it easier for the current easier to flow.

The following describes a nitride semiconductor device 600 according to Embodiment 3, with the manufacturing method thereof.

Figure 8:
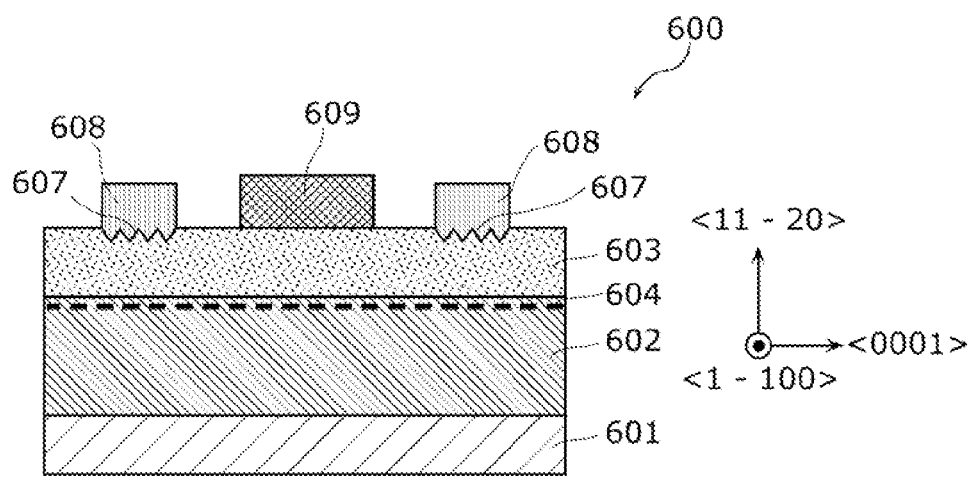
FIG. 8 is a cross-sectional view for showing a structure of a nitride semiconductor device according to Embodiment 3 of the present invention.

FIG. 8 is a cross-sectional view showing a structure of the nitride semiconductor device 600 according to the present embodiment.

As shown in FIG. 8, the nitride semiconductor device 600 according to the present embodiment includes a substrate 601, a GaN channel layer 602 which is a first nitride semiconductor layer, an AlGaN barrier layer 603 which is a second nitride semiconductor layer, an ohmic recess portion 607, an ohmic electrode 608, and a gate electrode 609. The bandgap of the AlGaN barrier layer 603 is wider than the bandgap of the GaN channel layer 602. A channel 604 formed by two-dimensional electron gas is generated near the heterojunction interface of the GaN channel layer 602 and the AlGaN barrier layer 603.

Each of FIG. 9A to FIG. 9D is a cross-sectional view showing a manufacturing process of the nitride semiconductor device 600 according to the present embodiment.

Figure 9A:
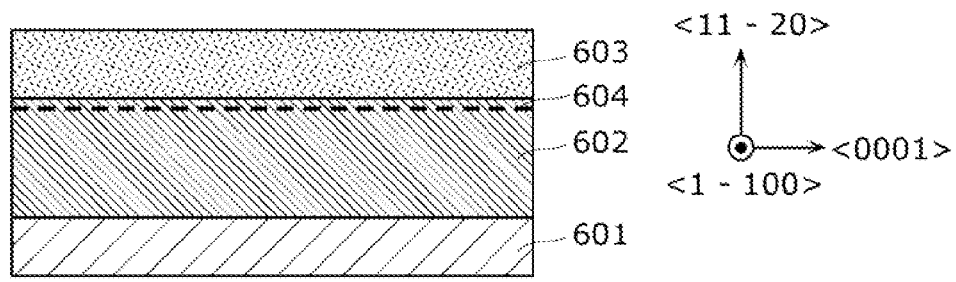
FIG. 9A is a cross-sectional view showing a manufacturing process of the nitride semiconductor device according to Embodiment 3 of the present invention.

As shown in FIG. 9A, with MOCVD, a GaN channel layer 602 and an AlGaN barrier layer 603 are sequentially grown on a main surface of a substrate 601, in a +a plane direction (<11-20> direction). The substrate 601 includes Si, GaN, sapphire, or SiC. The GaN channel layer 602 has the thickness of 2 μm. The AlGaN barrier layer 603 has the thickness of 25 nm (10 nm to 500 nm) and includes n-type Al$_{0.30}$Ga$_{0.70}$N doped with Si. At this time, an electric field is generated, by the doping of Si, at the heterojunction interface of the AlGaN barrier layer 603 and the GaN channel layer 602, whereby the charges are attracted to the heterojunction interface. Thus, the channel 604 formed by two-dimensional electron gas is generated in a part of the GaN channel layer 602.

It is to be noted that the main surface of the substrate 601 is a surface on which the GaN channel layer 602 and the AlGaN barrier layer 603 are grown in the +a plane direction. Furthermore, when the substrate 601 includes GaN, a buffer layer is required between the substrate 601 and the GaN channel layer 602. The buffer layer preferably includes AlN which has a high resistance, however, AlGaN or GaN may be included instead. In the same manner, when the substrate 601 includes Si, sapphire, or SiC, a buffer layer including GaN, AlGaN, AlN, or the like may be formed between the substrate 601 and the GaN channel layer 602.

Figure 9B:
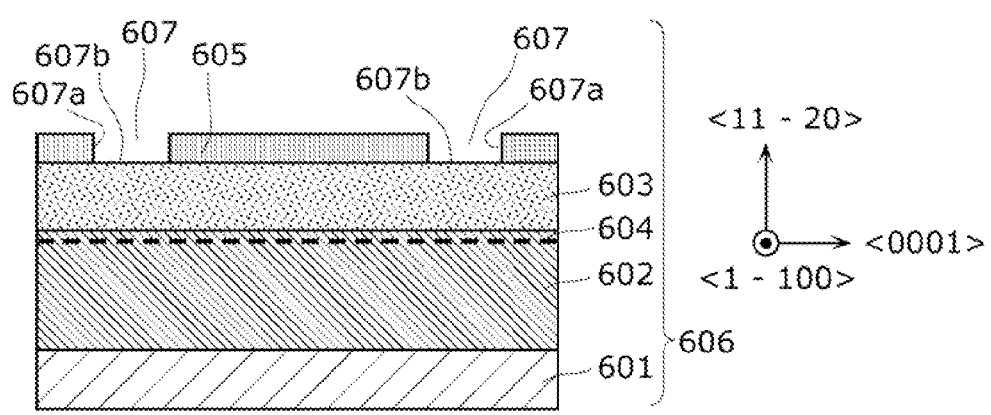
FIG. 9B is a cross-sectional view showing a manufacturing process of the nitride semiconductor device according to Embodiment 3 of the present invention.

Next, as shown in FIG. 9B, a mask 605 including, for example, SiO$_2$, is formed on the AlGaN barrier layer 603. The mask 605 is formed with a concave portion at a given position, by forming a SiO$_2$ layer on the AlGaN barrier layer 603, coating the upper surface of the SiO$_2$ layer with resist, and performing patterning. After that, wet etching is performed with hydrofluoric acid, the resist is removed, and patterning of the mask 605 is performed so that the ohmic recess portion 607 is formed. Thus, a stacked structure 606 is formed. It is to be noted that the ohmic recess portion 607 has the wall surface 607a and the bottom surface 607b. The wall surface 607a includes SiO$_2$ that is a material included in the mask 605 and the bottom surface 607b includes the AlGaN barrier layer 603.

The stacked structure 606 formed in the above manner is immersed in KOH solution in 25 degrees Celsius and having a concentration of 0.1 mol/l for 120 minutes, and wet etched. Thus, the high-resistance layer caused by the crystal defects due to dry etching is removed. Concurrently, a corrugated structure is formed in the bottom surface 607b of the ohmic recess portion 607 that is formed on a surface perpendicular to the <11-20> direction of the AlGaN barrier layer 603. The each of the facets (having a side of 30 nm or approximately 10 nm to 500 nm) has the (−1100) plane and the (01-10) plane.

Figure 9C:
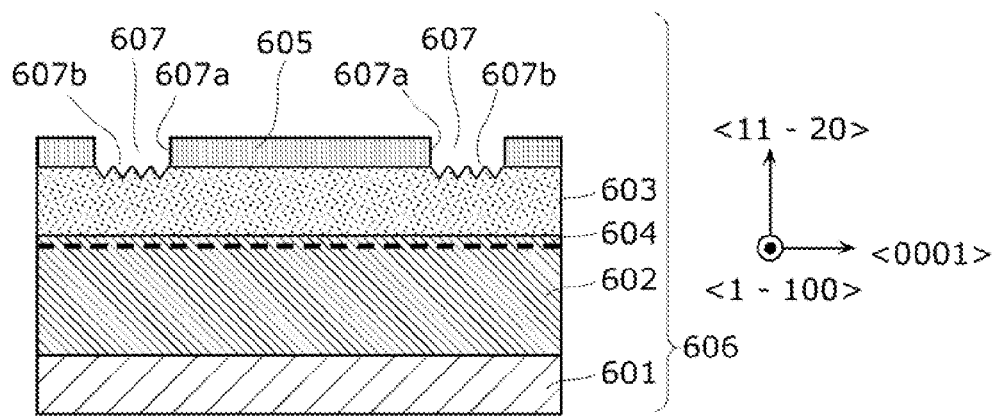
FIG. 9C is a cross-sectional view showing a manufacturing process of the nitride semiconductor device according to Embodiment 3 of the present invention.
Figure 9D:
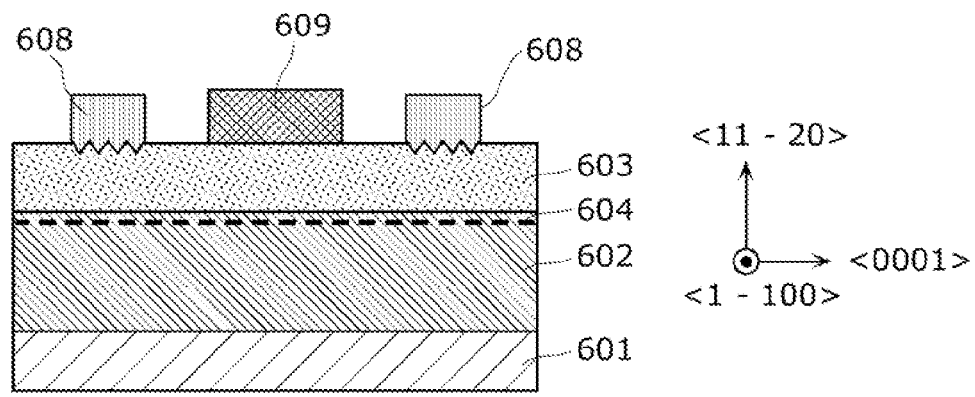
FIG. 9D is a cross-sectional view showing a manufacturing process of the nitride semiconductor device according to Embodiment 3 of the present invention.
Figure 10:
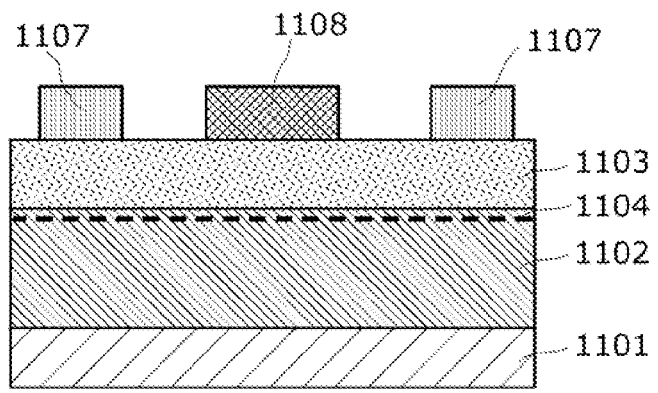
FIG. 10 is a cross-sectional view showing a structure of a conventional nitride semiconductor device.
Figure 11:
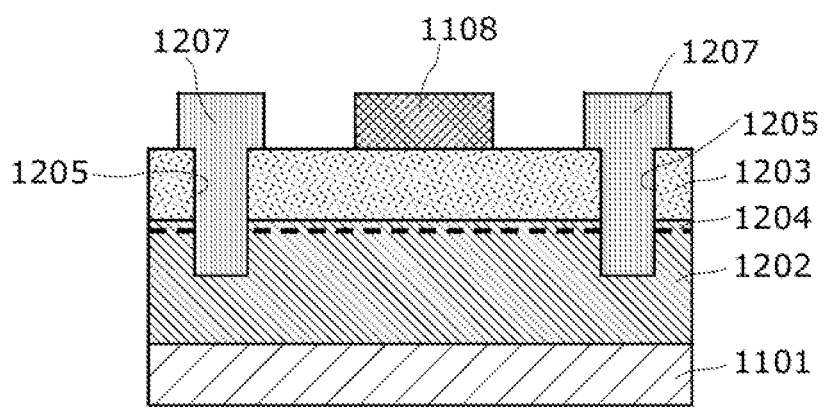
FIG. 11 is a cross-sectional view showing a structure of a nitride semiconductor device for describing a problem.

Next, as shown in FIG. 9C, the mask 605 is removed with hydrofluoric acid and a mask having a given pattern is placed so that an ohmic electrode 608 including, for example, Ti/Al is formed at a position in the bottom surface 607b of the ohmic recess portion 607 described above. Next, as shown in FIG. 9D, the gate electrode 609 including, for example, Ni/Au is formed. The ohmic electrode 608 and the gate electrode 609 are formed by sputtering, for example.

This is how the ohmic recess portion 607 is wet etched with KOH solution so that the high-resistance layer formed in the bottom surface 607b of the ohmic recess portion 607 is removed. Concurrently, the contact resistance can be reduced than in the conventional technique by suppressing the concentration of the electric field to, for example, a part having crystal defects because of the minute corrugated structure formed in the bottom surface 607b of the ohmic recess portion 607 while increasing the contact area of the ohmic electrode 608 and the bottom surface 607b of the ohmic recess portion 607. Thus, the contact resistance can be reduced than in the conventional technique.

It is to be noted that the present invention is not determined by the above embodiments and may be varied or modified without departing from the spirit of the present invention.

For example, material for the substrate, the first nitride semiconductor layer, the second nitride semiconductor layer, and the mask may be changed as appropriate, without being limited to those in the above embodiments. For example, regarding the GaN channel layer and the AlGaN barrier layer, the ratio of each atom may be changed by changing x and y in the nitride semiconductor $Al_xIn_yGa_{1-x-y}N$ (0≤x≤1, 0≤y≤1, 0 x+y≤1), and other nitride semiconductor material may also be used without being limited to the above embodiments.

Furthermore, a type of a substrate may be changed as appropriate, without being limited to those in the above embodiments. Furthermore, the main surface of the substrate is not limited to the +c plane (<0001> direction), the +a plane (<11-20> direction), and the +m plane (<1-100> direction), and may be a plane having an off-angle, that is, a plane having a plane direction deviated from a wafer surface. When the substrate includes Si, sapphire, or SiC, a buffer layer including GaN, AlGaN, AlN, or the like may be formed between the substrate and the GaN channel layer.

Furthermore, the forming method and the etching method of the nitride semiconductor device are not limited to the method described above and may be a combination of these method or another method.

Furthermore, the wall surface in the longitudinal direction of the ohmic recess portion is not necessarily parallel to the <1-100> direction or the <0001> direction as shown in the above embodiments. Because the wall surface and the bottom surface of the ohmic recess portion are etched in a crystal lattice unit by wet etching even when the wall surface and the bottom surface are angled from approximately negative 45 degrees to positive 45 degrees with respect to the <1-100> direction or the <0001> direction, the minute corrugated structure can be formed in the wall surface and the bottom surface of the ohmic recess portion, and the advantageous effects of the present invention are provided.

Furthermore, the nitride semiconductor device according to the present invention includes other embodiments achieved by combining arbitrary constituents in the above embodiments, other modification examples obtained by applying various modifications conceived by those skilled in the art to the above embodiments within a scope that does not deviate from the spirit of the present invention, and various devices including the nitride semiconductor device according to the present invention. For example, a device for use in high frequency including the nitride semiconductor device according to the present invention is also included in the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The nitride semiconductor device according to the present invention is especially useful as a transistor for use in high frequency and as a method of manufacturing the nitride semiconductor device.

The invention claimed is:

1. A nitride semiconductor device comprising:
   a first nitride semiconductor layer formed on a substrate;
   a second nitride semiconductor layer formed on said first nitride semiconductor layer and having a bandgap wider than a bandgap of said first nitride semiconductor layer;
   an ohmic recess portion formed in at least said second nitride semiconductor layer; and
   an ohmic electrode provided in contact with said ohmic recess portion,
   wherein said ohmic recess portion includes a corrugated structure in at least a part of a plane in contact with said ohmic electrode, and
   said corrugated structure is configured in the form of triangles each of which mainly has a (−1100) plane and a (01-10) plane.

2. The nitride semiconductor device according to claim 1, wherein said first nitride semiconductor layer and said second nitride semiconductor layer are stacked in a <0001> direction, and
   said corrugated structure is formed in a plane that is of said ohmic recess portion and perpendicular to a <11-20> direction.

3. The nitride semiconductor device according to claim 1, wherein said first nitride semiconductor layer and said second nitride semiconductor layer are stacked in a <1-100> direction, and
   said corrugated structure is formed in a plane that is of said ohmic recess portion and perpendicular to the <11-20> direction.

4. The nitride semiconductor device according to claim 1, wherein said first nitride semiconductor layer and said second nitride semiconductor layer are stacked in the <11-20> direction, and
   said corrugated structure is formed in a plane that is of said ohmic recess portion and perpendicular to the <11-20> direction.

5. The nitride semiconductor device according to claim 1, wherein said corrugated structure is formed in a plane that is of said ohmic recess portion and perpendicular to the <1-100> direction, and is configured in the form of grooves each of which has a (10-10) plane that is formed in parallel to the <11-20> direction.

6. A method of manufacturing a nitride semiconductor device including an ohmic electrode, said method comprising:
   forming a first nitride semiconductor layer on a substrate;
   forming, on the first nitride semiconductor layer, a second nitride semiconductor layer which has a bandgap wider than a bandgap of the first nitride semiconductor layer;
   forming an ohmic recess portion in at least the second nitride semiconductor layer; and
   forming a corrugated structure in at least a part of a plane in contact with the ohmic electrode in the ohmic recess portion,
   wherein, in said forming of a corrugated structure, the corrugated structure is formed by wet etching so as to be configured in the form of triangles each of which mainly has a (−1100) plane and a (01-10).

7. The method of manufacturing a nitride semiconductor device according to claim 6, further comprising
   forming the ohmic electrode in contact with the ohmic recess portion.

8. A nitride semiconductor device according to claim 1, wherein said ohmic recess portion is formed to have a rectangular shape having two longer sides opposed to each other and two shorter sides opposed to each other, the longer sides extending along a <1-100> direction,
   and wherein said corrugated structure is formed on two surfaces opposed to each other along said longer sides.

9. The nitride semiconductor device according to claim 1, wherein a side of said corrugated structure has a size of 10 nm to 500 nm.

10. The nitride semiconductor device according to claim 9, wherein a side of said corrugated structure has a size of about 30 nm.

* * * * *